US009153984B2

(12) United States Patent
Ono et al.

(10) Patent No.: US 9,153,984 B2
(45) Date of Patent: Oct. 6, 2015

(54) CHARGING DEVICE

(71) Applicant: Renesas Electronics Corporation, Kawasaki-shi, Kanagawa (JP)

(72) Inventors: Yoshiharu Ono, Kanagawa (JP); Tsutomu Tanaka, Kanagawa (JP); Mamoru Mochizuki, Tokyo (JP); Takashi Makita, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 226 days.

(21) Appl. No.: 13/771,322

(22) Filed: Feb. 20, 2013

(65) Prior Publication Data

US 2013/0241469 A1        Sep. 19, 2013

(30) Foreign Application Priority Data

Mar. 19, 2012   (JP) ................................. 2012-062212

(51) Int. Cl.
*H02J 7/00*            (2006.01)

(52) U.S. Cl.
CPC ............. *H02J 7/0042* (2013.01); *H02J 7/0006* (2013.01); *H02J 7/0052* (2013.01); *H02J 2007/0001* (2013.01); *H02J 2007/0062* (2013.01)

(58) Field of Classification Search
CPC ........... H02J 7/00; H02J 7/006; H02J 7/0042; H02J 7/0052; G06F 1/26; G06F 13/00
USPC .................... 320/100, 107, 162; 713/300, 340
See application file for complete search history.

(56) References Cited

U.S. PATENT DOCUMENTS 7,170,259 B2 *   1/2007   Veselic .......................... 320/114
7,581,119 B2 *   8/2009   Tupman et al. ............... 713/300
7,890,783 B2     2/2011   Tupman et al.
(Continued)

FOREIGN PATENT DOCUMENTS

JP        2005-006497 A       1/2005
JP        3811704 B2           8/2006
(Continued)

OTHER PUBLICATIONS

"Battery Charging Specification", Revision 1.2, Dec. 7, 2010, USB Implementers Forum, Inc. <URL: http://www.usb.org/developers/devclass_docs>.
Office Action issued May 12, 2015, in Japanese Patent Application No. 2012-062212.

*Primary Examiner* — Mohammed Alam
(74) *Attorney, Agent, or Firm* — Miles & Stockbridge P.C.

(57) ABSTRACT

There is provided a charging device which can rapidly charge, with a single charger, portable devices of a plurality of charging specifications.
A plurality of available power indicating circuits included in a USB module 10 notify, through a data line, a portable device coupled to the charging device of a signal indicating suppliable amount of current. A CPU 4 obtains, from a portable device coupled thereto, information identifying the portable device, at the time of adjustment. A memory 6 has a table stored therein, for a plurality of portable devices, defining a correspondence between information identifying a portable device and an available power indicating circuit. Referring to the table based on the obtained information, the CPU 4 selects an available power indicating circuit and, at the time of actual operation, activates only the selected available power indicating circuit.

4 Claims, 9 Drawing Sheets

(56) References Cited

U.S. PATENT DOCUMENTS

| | | |
|---|---|---|
| 8,289,002 B2 | 10/2012 | Lin et al. |
| 2005/0001590 A1* | 1/2005 | Bayne et al. .................. 320/128 |
| 2010/0201308 A1* | 8/2010 | Lindholm ..................... 320/107 |
| 2013/0069600 A1* | 3/2013 | Knowlton et al. ............ 320/162 |
| 2014/0239985 A1 | 8/2014 | Sims et al. |

FOREIGN PATENT DOCUMENTS

| | | |
|---|---|---|
| JP | 4664362 B2 | 4/2011 |
| JP | 4695220 B2 | 6/2011 |
| JP | 2011-234355 A | 11/2011 |
| JP | 2011-244679 A | 12/2011 |

* cited by examiner

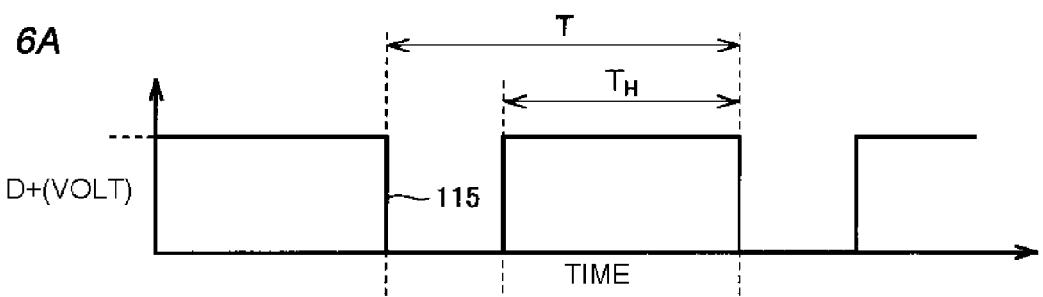
FIG. 6A
FIG. 6B
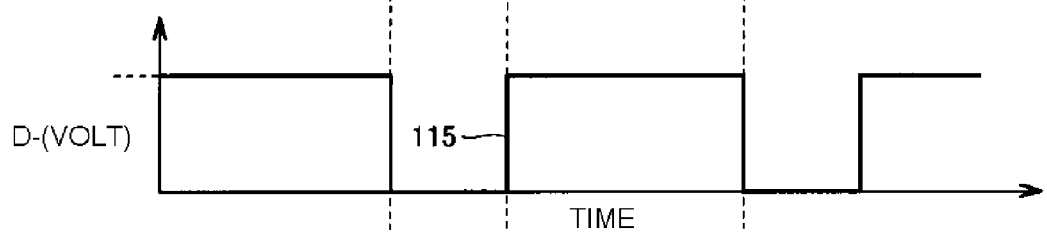
FIG. 7
| V_ID | P_ID | AVAILABLE POWER INDICATING CIRCUIT | LIMIT VALUE OF CURRENT SUPPLY AMOUNT |
|---|---|---|---|
| 0x**** | 0x**** | A | 1.0A |
| 0x**** | 0x**** | B | 1.5A |
| . | . | . | . |

FIG. 10

| AVAILABLE POWER INDICATING CIRCUIT | CIRCUIT A | CIRCUIT A | CIRCUIT A | CIRCUIT B | CIRCUIT B | CIRCUIT C | DETERMINATION | CIRCUIT A |
|---|---|---|---|---|---|---|---|---|
| DETERMINATION CONTENT | 0.2A DETERMINATION | 0.6A DETERMINATION | 1.6A DETERMINATION | 1.5A DETERMINATION | 2A DETERMINATION | 1.5A DETERMINATION | | 1.6A DETERMINATION |
| SETTING OF D+,D− | VOLTAGE LEVEL D+:H1 D−:H2 | VOLTAGE LEVEL D+:H3 D−:H4 | VOLTAGE LEVEL D+:H5 D−:H6 | WAVEFORM OUTPUT WAVEFORM A | WAVEFORM OUTPUT WAVEFORM B | D+,D− SHORT CIRCUIT | | VOLTAGE LEVEL D+:H5 D−:H6 |
| CURRENT LIMIT OF POWER SUPPLY IC | 0.5A | 0.8A | 1.8A | 1.8A | 2.1A | 1.8A | | 1.8A |
| READING OF ADC | 0.1A | 0.1A | 1.2A | 0.1A | 0.1A | 0.1A | | — |

VBUS OFF/ON arrows appear between each column.

DETERMINATION FLOW →

CHARGING DEVICE

CROSS-REFERENCE TO RELATED APPLICATION

The disclosure of Japanese Patent Application No. 2012-062212 filed on Mar. 19, 2012 including the specification, drawings and abstract is incorporated herein by reference in its entirety.

BACKGROUND

The present invention relates to a charging device, for example, a charging device which charges a portable device via a universal serial bus.

In recent years, charging of portable devices via a USB has been becoming common. With USB2.0, the maximum current that can be taken out from a port is defined as 500 mA, and there is a problem in which it takes a while to charge a high-capacity secondary battery.

To address such problems, there is proposed a mechanism which can determine the power supply ability of the USB charger (host) side and obtain a current exceeding 500 mA from a charger having sufficient power supply ability (Japanese Patent No. 4695220 (Patent Document 1), Japanese Patent No. 4664362 (Patent Document 2), U.S. Pat. No. 7,581,119 B2 (Patent Document 3), Japanese Patent No. 3811704 (Patent Document 4), U.S. Pat. No. 7,170,259 B2 (Patent Document 5), Japanese Patent Laid-Open No. 2005-6497 (Patent Document 6), and Battery Charging v1.2 Specification, Internet <URL: http://www.usb.org/developers/dev-class_docs> (Non-Patent Document 1), for example).

SUMMARY

However, there exist currently various standards, and thus rapid charging of many portable devices becomes possible only by dedicated chargers.

The other problems and new feature will become clear from the descriptions in the specification and accompanying drawings.

A charging device according to an embodiment includes a plurality of available power indicating circuits which notify, through a data line, a portable device coupled to the charging device of a signal indicating suppliable amount of current. A control unit obtains, from a portable device coupled thereto, information identifying the portable device, at the time of adjustment. A storage unit has a table stored therein, for a plurality of portable devices, defining a correspondence between information identifying a portable device and an available power indicating circuit. Referring to the table based on the obtained information, the control unit selects an available power indicating circuit and, at the time of actual operation, activates only the selected available power indicating circuit.

According to the embodiment described above, a single charger can rapidly charge portable devices of a plurality of charging specifications.

BRIEF DESCRIPTION OF THE DRAWINGS

FIGS. 6A and 6B each show an exemplary charger configuration signal 115 simultaneously transmitted over data lines D+ and D−;

FIG. 7 shows an exemplary table;

FIG. 10 shows an exemplary determination procedure according to an exemplary variation of the second embodiment.

DETAILED DESCRIPTION

Figure 1:
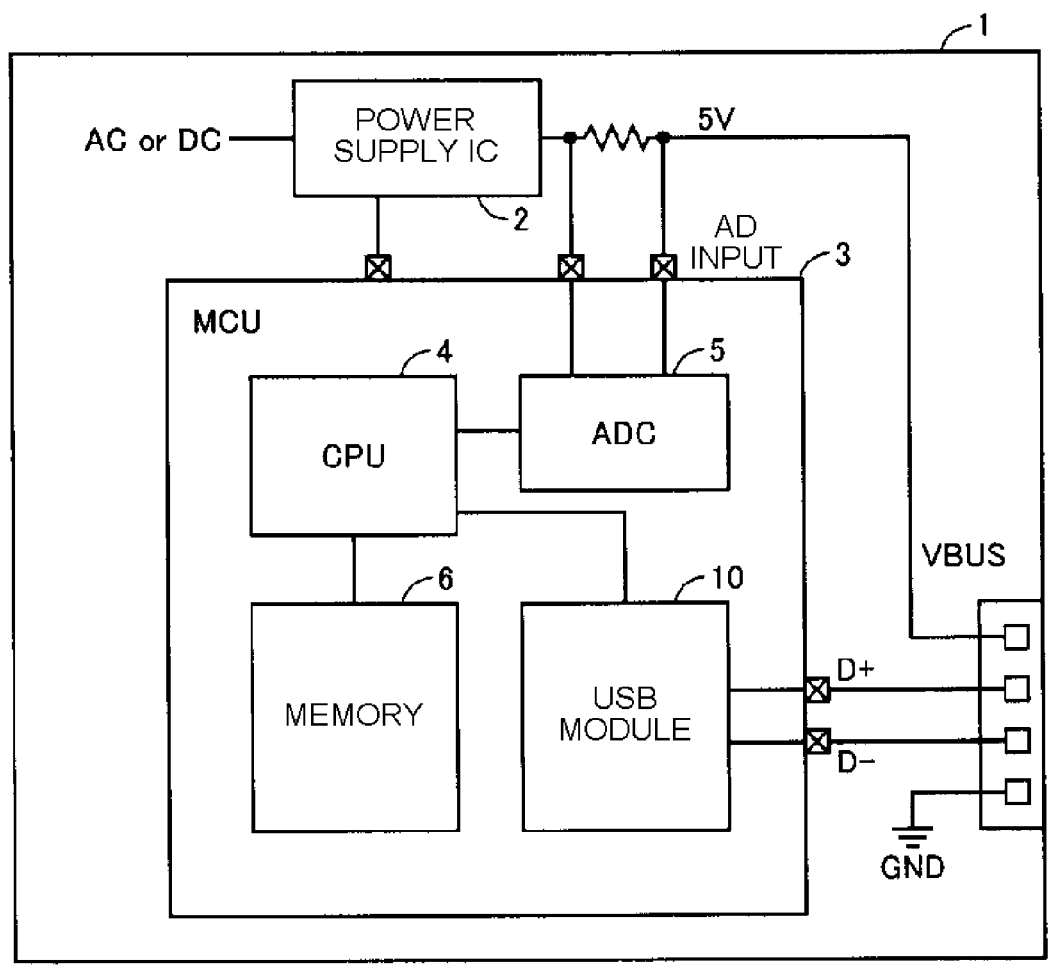
FIG. 1 shows a configuration of a charger of an embodiment.

An embodiment of the present invention will be described below, referring to the drawings.

First Embodiment

FIG. 1 shows a configuration of a charger of the present embodiment.

Referring to FIG. 1, the charger 1 includes a power supply IC (Integrated Circuit) 2 and an MCU (Micro Control Unit) 3.

The power supply IC2 supplies current to a portable device coupled through a voltage bus VBUS.

The MCU 3 includes a CPU (Central Processing Unit) 4, an ADC (Analog to Digital Converter) 5, a memory 7, and a USB (Universal Serial Bus) module 10.

Figure 2:
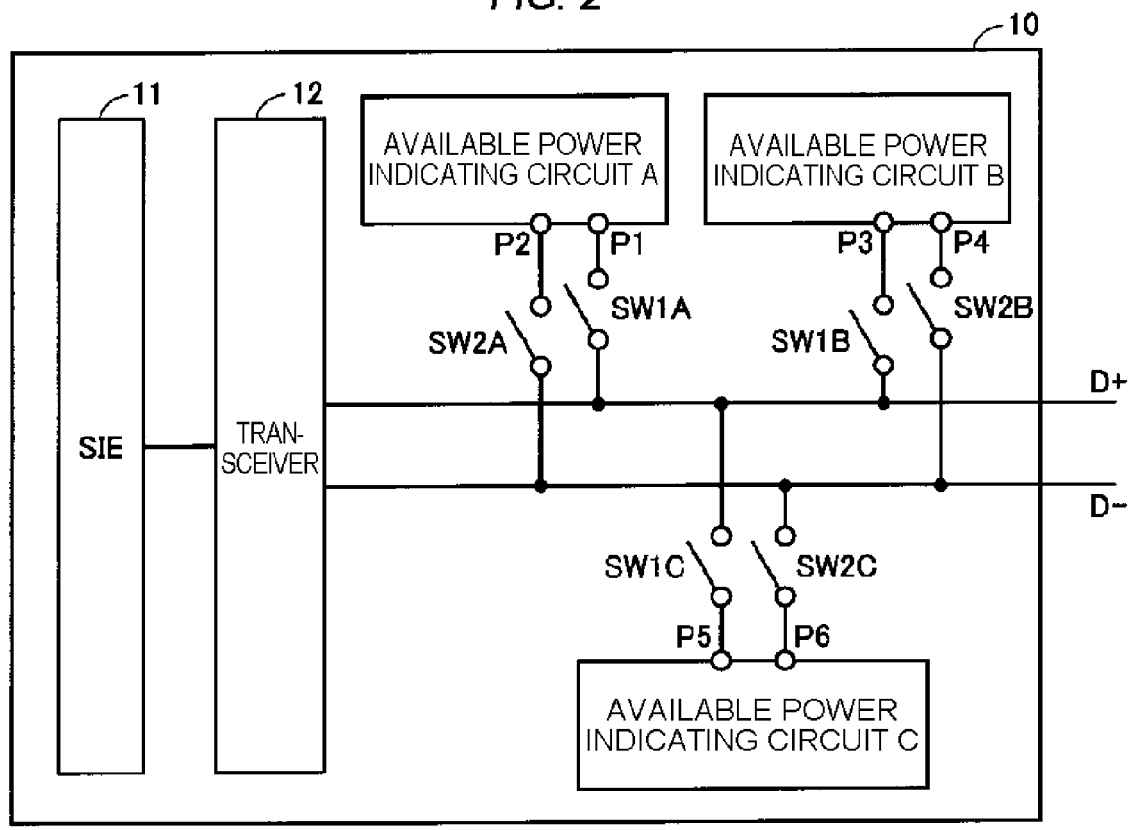
FIG. 2 shows a configuration of a USB module 10.

FIG. 2 shows a configuration of the USB module 10. The USB module 10 has an SIE (Serial Interface Engine) 11, a transceiver 12, an available power indicating circuit A, an available power indicating circuit B, an available power indicating circuit C, and switches SW1A, SW2A, SW1B, SW2B, SW1C, and SW2C.

The SIE 11 is a logical circuit which processes details of a low level USB protocol. The transceiver 12 processes the physical transmission and reception function of the USB.

The available power indicating circuits A, B, and C notify, through a data line, a portable device coupled to the charging device of a signal indicating suppliable amount of current.

Figure 3:
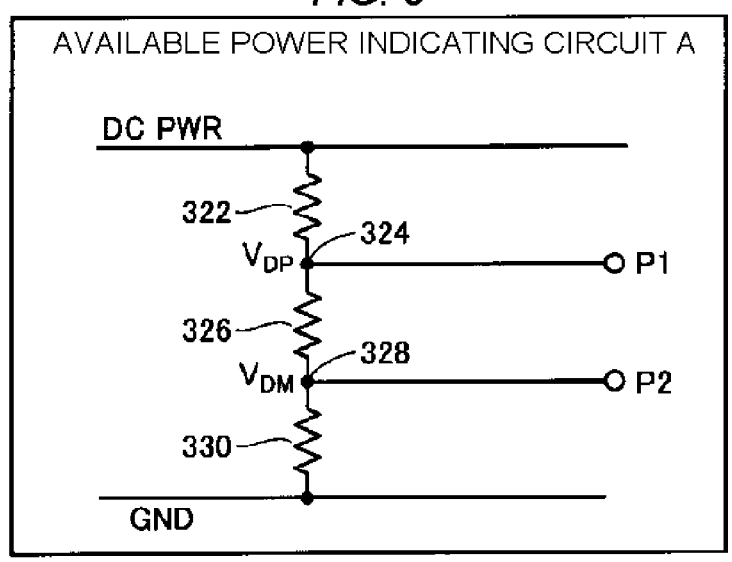
FIG. 3 shows a configuration of an available power indicating circuit A.

FIG. 3 shows a configuration of the available power indicating circuit A. Referring to FIG. 3, the available power indicating circuit A includes resistors 322, 326, and 330. DC PWR (e.g., 5.0V) is voltage-divided by the resistors 322, 326, and 330. A voltage VDP which has been voltage-divided from a node 324 is output to a terminal P1. The terminal P1 is coupled to the data line D+ via a switch SW1A. A voltage VDM which has been voltage-divided from a node 328 is output to a terminal P2. The terminal P2 is coupled to the data line D− via a switch SW2A. By the voltages VDP and VDM, the portable device coupled thereto recognizes the current supply ability of a charger 1.

Figure 4:
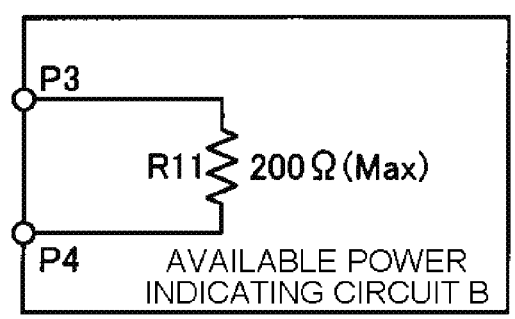
FIG. 4 shows a configuration of an available power indicating circuit B.

FIG. 4 shows a configuration of an available power indicating circuit B. The available power indicating circuit B corresponds to a Dedicated Charging Port (referred to as DCP, in the following) in the "Battery Charging Specification" which is the power supply specifications of the USB. DCP is a port having a current supply ability of 1.5 A at the maximum.

As shown in FIG. 4, terminals P3 and P4 are coupled by a resistor R11 (e.g., a maximum of 200 Ω) between. The portable device applies a voltage to the data line D+. The available power indicating circuit B receives a voltage from the terminal P3 coupled to the data line D+. The voltage received by the resistor R11 is reduced and output from the terminal P4 to the data line D−. The coupled side of the portable device recognizes the current supply ability of charger 1, in accordance with the magnitude of the voltage in the data line D−. That is, the portable device recognizes that the current supply ability of the charger 1 is 1.5 A, when the magnitude of the voltage over the data line D− is equal to or larger than a predetermined value. In comparison, the Standard downstream port (SDP in the following) having a current supply ability of 500 mA in the "Battery Charging Specification" has no mechanism of returning the voltage which has been received from the terminal coupled over the data line D+ to the data line −. Therefore, the portable device recognizes that the current supply ability of the charger 1 is 500 mA, when the magnitude of the voltage over the data line D− is equal to or less than a predetermined value.

Figure 5:
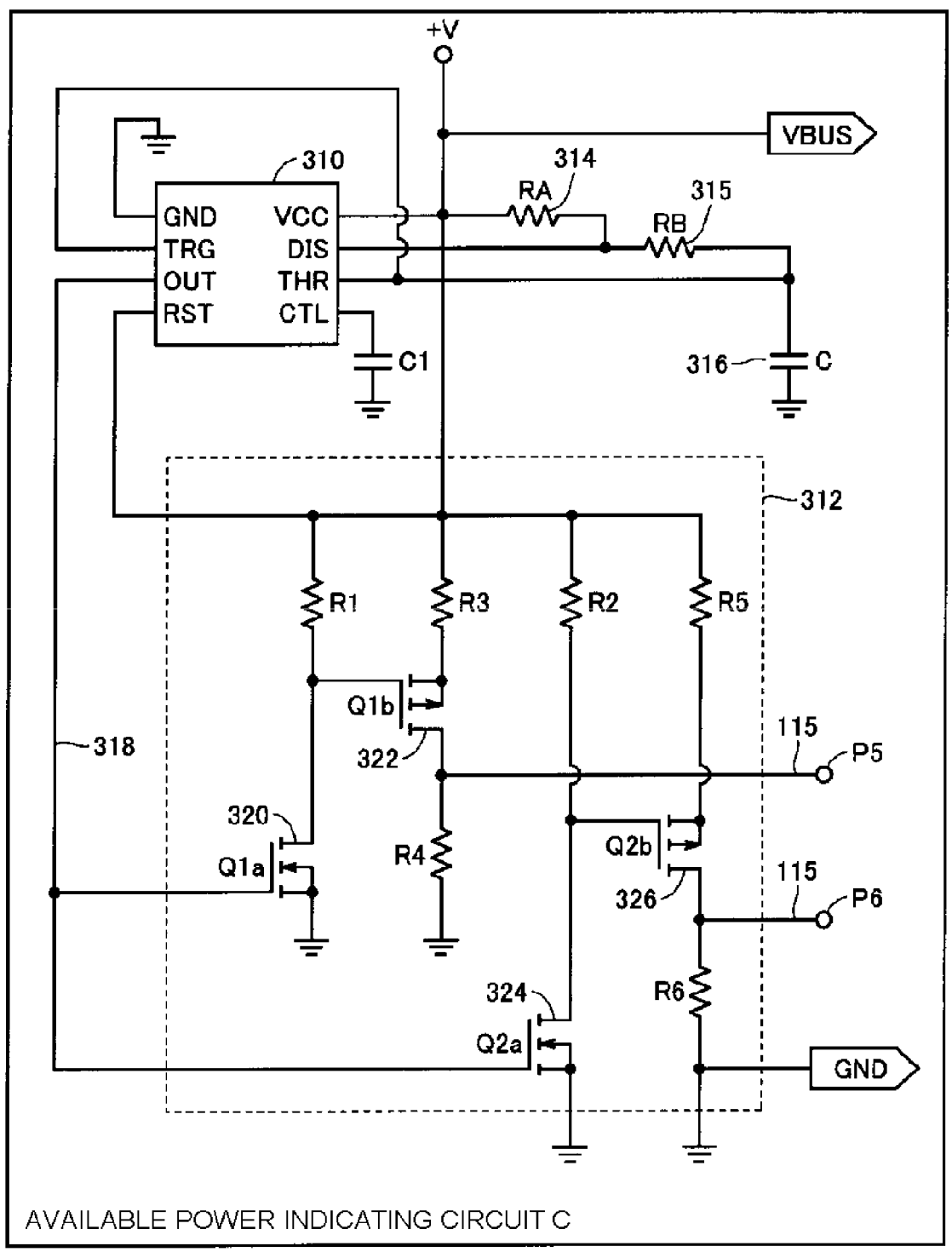
FIG. 5 shows a configuration of an available power indicating circuit C.

FIG. 5 shows a configuration of the available power indicating circuit C. As shown in FIG. 5, the available power indicating circuit C is equivalent to a signal generator 114 described in Patent Document 6.

The available power indicating circuit C has a digital timer 310, a switching circuit 312, and RC circuits 314 to 316.

The available power indicating circuit C operates as follows. The frequency and the duty cycle of a charger configuration signal 115 can be adjusted by selecting the values of resistors and capacitors in the RC circuits 314 to 316.

The digital timer 310 may be a standard timer IC, for example. The timer 310 generates a timer output signal 318 which may be subject to tuning by changing the values of resistors and capacitors in the RC circuits 314 to 316. The RC circuits 314 to 316 are coupled between the discharge (DIS) input and the threshold (THR) input of the timer 310.

The timer output signal 318 is coupled as an input of two transistor pairs 320 and 322, and 324 and 326 in the switching circuit 312. The switching circuit 312 adjusts the peak voltage and impedance output from terminals P5 and P6 to the data lines D+ and D−.

FIGS. 6A and 6B each show an exemplary charger configuration signal 115 simultaneously transmitted over data lines D+ and D−. FIG. 6A has the charger configuration signal 115 over the data line D+ plotted along the time axis. FIG. 6B has the charger configuration signal 115 over the data line D− plotted along the time axis.

The charger configuration signal 115 is a periodic digital signal having a constant frequency (1/T) and a constant duty cycle (TH/T). The frequency (1/T) and the duty cycle (TH/T) of the charger configuration signal 115 are set to indicate the current supply ability of the charger 1. Using the constant frequency (1/T) and the constant duty cycle (TH/T), the coupled side of the portable device recognizes the current supply ability of the charger 1.

Referring to FIG. 1 again, a memory 6 stores, for a plurality of portable devices, a table defining the correspondence between the information identifying a portable device and an available power indicating circuit and the limit value for the current supply amount (maximum current supply amount).

FIG. 7 shows an exemplary table. A vender ID (V_ID) and a product ID (P_ID) are used as information identifying a portable device.

A CPU 4 obtains, from a portable device coupled thereto, information identifying the portable device when performing enumeration which is an adjustment stage. Enumeration is a procedure for identifying a portable device whose host (charger 1) is coupled to a USB. During enumeration, the portable device reports its configuration to the host (charger 1). At the time of recognizing the configuration of the portable device, the host (charger 1) is allowed to use the portable device.

Referring to the table based on the obtained information, the CPU 4 selects an available power indicating circuit and, at the time of actual operation, activates only the selected available power indicating circuit, and also turns on only a switch coupled to the activated available power indicating circuit. In addition, referring to the table, the CPU 4 sets, in the power supply IC2, a limit value for the amount of current to be supplied corresponding to the obtained identification information.

(Operation)

Figure 8:
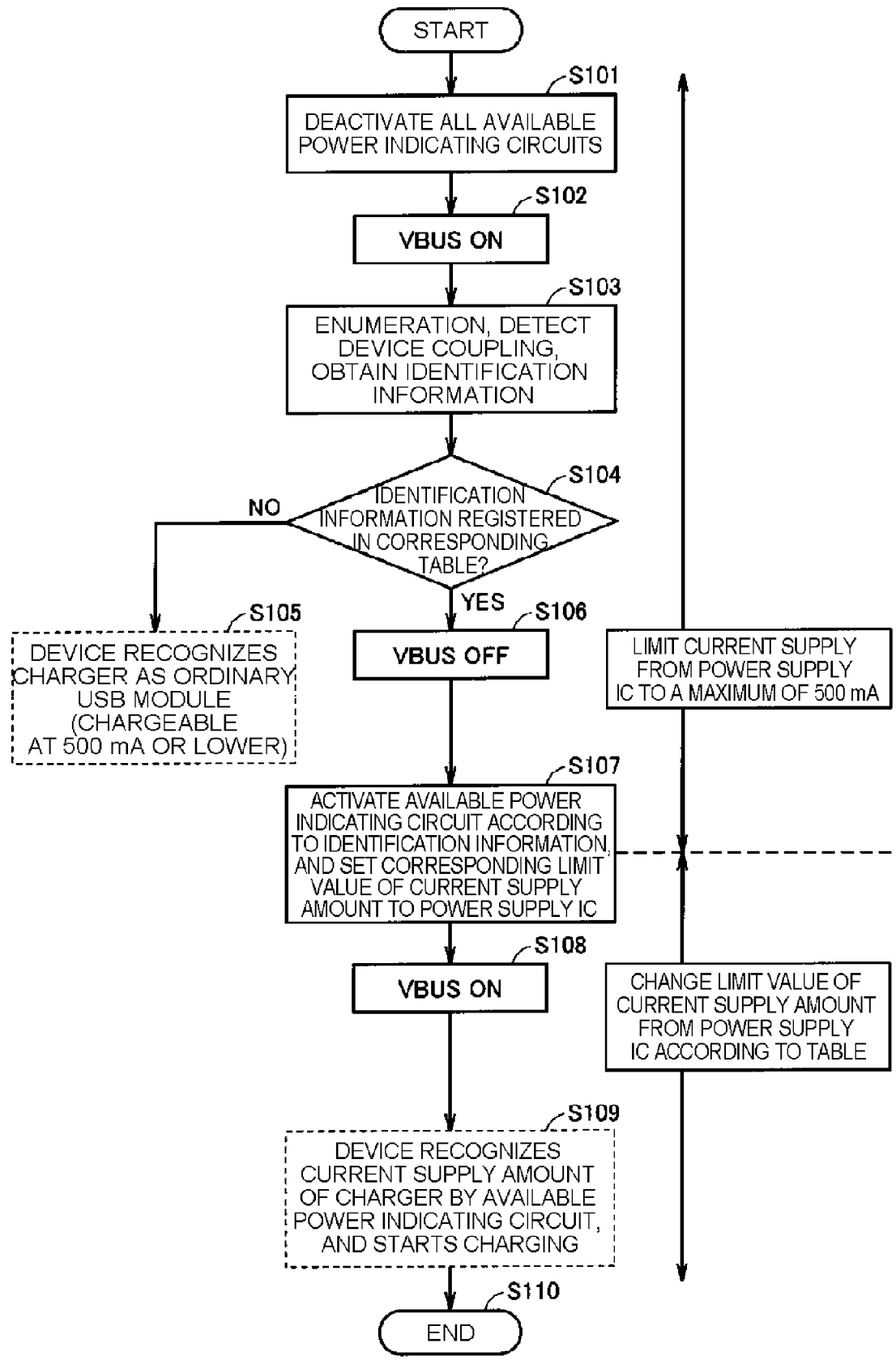
FIG. 8 is a flowchart representing an operation procedure of a first embodiment.

FIG. 8 is a flow chart representing an operation procedure of the first embodiment.

First, the CPU 4 deactivates all the available power indicating circuits A, B, and C, and turns off all the switches SW1A, SW2A, SW1B, SW2B, SW1C, and SW2C coupled to the available power indicating circuits A, B, and C (step S101).

Next, the CPU 4 causes the power supply IC2 to supply current to the portable device through the voltage bus VBUS (step S102).

Subsequently, the CPU 4 performs enumeration, detects existence of coupling of the portable device through the SIE 11, and obtains information identifying the portable device (vendor ID, product ID) (step S103).

When the obtained information identifying the portable device is not registered in the table (NO at step S104), the portable device being coupled recognizes the charger 1 as an ordinary USB module and charges it with 500 mA or lower (step S105).

When the obtained information identifying the portable device is registered in the table (YES at step S104), the CPU 4 causes the power supply IC2 to terminate supply of current through the voltage bus VBUS (step S106).

Referring to the table at the time of actual operation, the CPU 4 activates an available power indicating circuit corresponding to the obtained identification information, and turns on the switch coupled to the available power indicating circuit corresponding to the obtained identification information. In addition, referring to the table, the CPU 4 sets, in the power supply IC2, a limit value for the amount of current to be supplied corresponding to the obtained identification information (step S107).

Next, the CPU 4 causes the power supply IC2 to supply current to the portable device through the voltage bus VBUS (step S108).

Subsequently, the portable device coupled thereto recognizes the current supply amount of the charger, in accordance with the activated available power indicating circuit, and performs charging (step S109).

According to the present embodiment, as has been described above, knowing the type of the portable device coupled thereto allows activation of an available power indicating circuit suited to the type, causing the portable device coupled thereto to recognize the current supply amount of the charger. As a result, according to the present embodiment, a single charger can support a plurality of charging specifications, allowing rapid charging of portable device coupled thereto.

Second Embodiment

The second embodiment differs from the first embodiment in the following points.

The ADC5 measures the amount of current supplied to the portable device through a voltage bus (VBUS).

The CPU 4 activates available power indicating circuits one by one at the time of adjustment, causes the ADC5 to measure the amount of current supplied to the portable device coupled through the voltage bus (VBUS), and stores the measurement result in the memory 6.

Referring to the memory 6, the CPU 4 selects an available power indicating circuit exhibiting the maximum current supply amount and, at the time of actual operation, activates only the selected available power indicating circuit, and also turns on only the switch coupled to the activated available power indicating circuit. In addition, the CPU 4 sets, in the power supply IC2, a limit value for the amount of current to be supplied corresponding to the available power indicating circuit to be activated.

Figure 9:
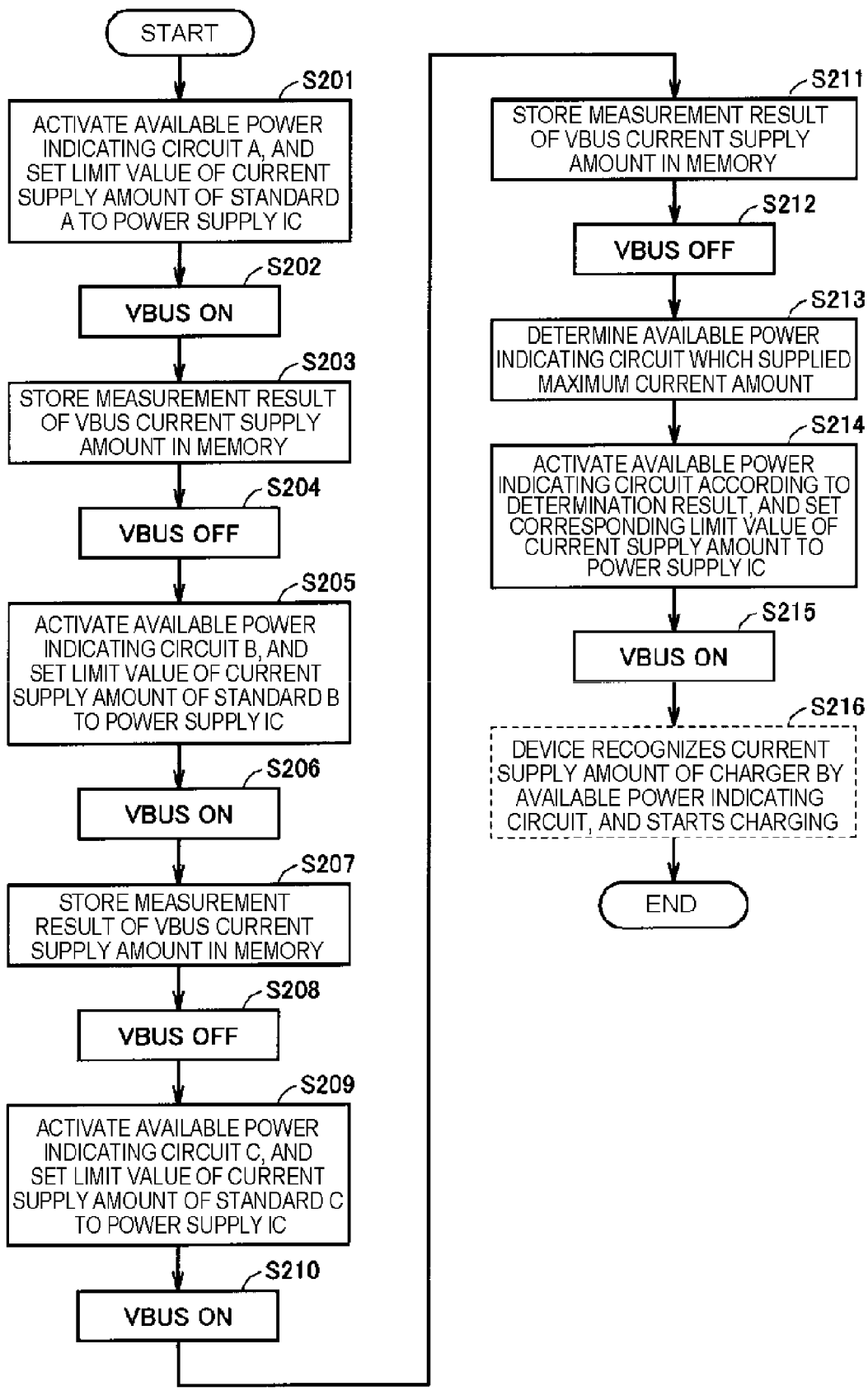
FIG. 9 is a flow chart representing an operation procedure of a second embodiment.

FIG. 9 is a flowchart representing an operation procedure of the second embodiment. Referring to FIG. 9, the CPU 4 first activates only the available power indicating circuit A, turns on the switches SW1A and SW2A coupled to the available power indicating circuit A, and turns off the remaining switches SW1B, SW2B, SW1C, and SW2C. The CPU 4 sets, in the power supply IC2, a limit value for the current supply amount corresponding to the available power indicating circuit A (corresponding to the standard A) (step S201).

Next, the CPU 4 causes the power supply IC2 to supply current to the portable device through the voltage bus VBUS (step S202).

Subsequently, the ADC5 measures, for a certain time period, the amount of current supplied through the voltage bus VBUS. The CPU 4 stores, in the memory 6, the maximum amount of current detected in the ADC5 (step S203).

Then, the CPU 4 causes the power supply IC2 to terminate supply of current through the voltage bus VBUS (step S204).

Next, the CPU 4 activates only the available power indicating circuit B, turns on the switches SW1B and SW2B coupled to the available power indicating circuit B, and turns off the remaining switches SW1A, SW2A, SW1C, and SW2C. The CPU 4 sets, in the power supply IC2, a limit value for the current supply amount corresponding to the available power indicating circuit B (corresponding to the standard B) (step S205).

Subsequently, the CPU 4 causes the power supply IC2 to supply current to the portable device through the voltage bus VBUS (step S206).

Then, the ADC5 measures, for a certain time period, the amount of current supplied through the voltage bus VBUS. The CPU 4 stores, in the memory 6, the maximum amount of current detected in the ADC5 (step S207).

Subsequently, the CPU 4 causes the power supply IC2 to terminate supply of current through the voltage bus VBUS (step S208).

Then, the CPU 4 activates only the available power indicating circuit C, turns on the switches SW1C and SW2C coupled to the available power indicating circuit C, and turns off the remaining switches SW1A, SW2A, SW1B, and SW2B. The CPU 4 sets, in the power supply IC2, a limit value for the current supply amount corresponding to the available power indicating circuit C (corresponding to the standard C) (step S209).

Next, the CPU 4 causes the power supply IC2 to supply current to the portable device through the voltage bus VBUS (step S210).

Subsequently, the ADC5 measures, for a certain time period, the amount of current supplied through the voltage bus VBUS. The CPU 4 stores, in the memory 6, the maximum amount of current detected in the ADC5 (step S211).

Then, the CPU 4 causes the power supply IC2 to terminate supply of current through the voltage bus VBUS (step S212).

Next, referring to data stored in the memory, the CPU 4 selects the available power indicating circuit which has supplied the maximum amount of current (step S213).

Subsequently, the CPU 4 activates the selected available power indicating circuit at the time of actual operation, and turns on the switch coupled to the selected available power indicating circuit. In addition, the CPU 4 sets, in the power supply 102, a limit value for the current supply amount corresponding to selected available power indicating circuit (step S214).

Then, the CPU 4 causes the power supply 102 to supply current to the portable device through the voltage bus VBUS (step S215).

Next, the portable device coupled thereto recognizes the current supply amount of the charger in accordance with the activated available power indicating circuit, and performs charging (step S216).

According to the present embodiment, as has been described above, an available power indicating circuit can be selected so that the current available at the portable device is maximized. As a result, a single charger can support a plurality of charging specifications, allowing rapid charging of portable device coupled thereto. In addition, a limit value for the amount of current to be supplied from the power supply IC can be set in accordance with the portable device.

[Exemplary Variation of the Second Embodiment]

In this exemplary variation, the CPU 4 sets one or more limit values for the amount of current to be supplied through the voltage bus (VBUS), in accordance with the available power indicating circuit to be activated at the time of adjustment. The CPU 4 causes the ADC5 to measure, for a certain time period, the amount of current to be supplied to the portable device through the voltage bus VBUS under respective limit values, and stores the maximum value of the measured amount of current in the memory 6.

Referring to the memory 6, the CPU 4 selects an available power indicating circuit exhibiting the maximum current supply amount and a limit value for the amount of current to be supplied, activates only the selected available power indicating circuit at the time of actual operation, and sets, in the power supply IC2, the limit value for the amount of current to be supplied.

FIG. 10 shows an exemplary determination procedure according to an exemplary variation of the second embodiment. First, the available power indicating circuit A is selected, and the limit value for the current supply amount of the power supply 102 is set to 0.5 A. At this time, the maximum value within a certain time period of the amount of current supplied to the portable device through the voltage bus VBUS is measured to be 0.1 A. Next, the limit value for the current supply amount of the power supply 102 is changed to 0.8 A. At this time, the maximum value within a certain time period of the amount of current supplied to the portable device through the voltage bus VBUS is measured to be 0.1 A. Next, the limit value for the current supply amount of the power supply 102 is changed to 1.8 A. At this time, the maximum value within a certain time period of the amount of current supplied to the portable device through the voltage bus VBUS is measured to be 1.2 A.

Next, the available power indicating circuit B is selected, and the limit value for the current supply amount of the power supply IC2 is set to 1.8 A. At this time, the maximum value within a certain time period of the amount of current supplied to the portable device through the voltage bus VBUS is measured to be 0.1 A. Next, the limit value for the current supply amount of the power supply IC2 is changed to 2.1 A. At this time, the maximum value within a certain time period of the amount of current supplied to the portable device through the voltage bus VBUS is measured to be 0.1 A.

Subsequently, the available power indicating circuit C is selected, and the limit value for the current supply amount of the power supply IC2 is set to 1.8 A. At this time, the maximum value within a certain time period of the amount of current supplied to the portable device through the voltage bus VBUS is measured to be 0.1 A.

As a result of the above, in the case where the available power indicating circuit is A and the limit value for the current supply amount of the power supply IC2 is 1.8 A, the maximum value within a certain time period of the amount of current supplied to the portable device through the voltage bus VBUS is maximized. Therefore, at the time of actual operation, only the available power indicating circuit A is activated, and 1.8 A is set, in the power supply IC, as the limit value for the amount of current supplied.

Third Embodiment

The third embodiment is a combination of the selection of an available power indicating circuit by the first embodiment and the selection of an available power indicating circuit by the second embodiment.

Figure 11:
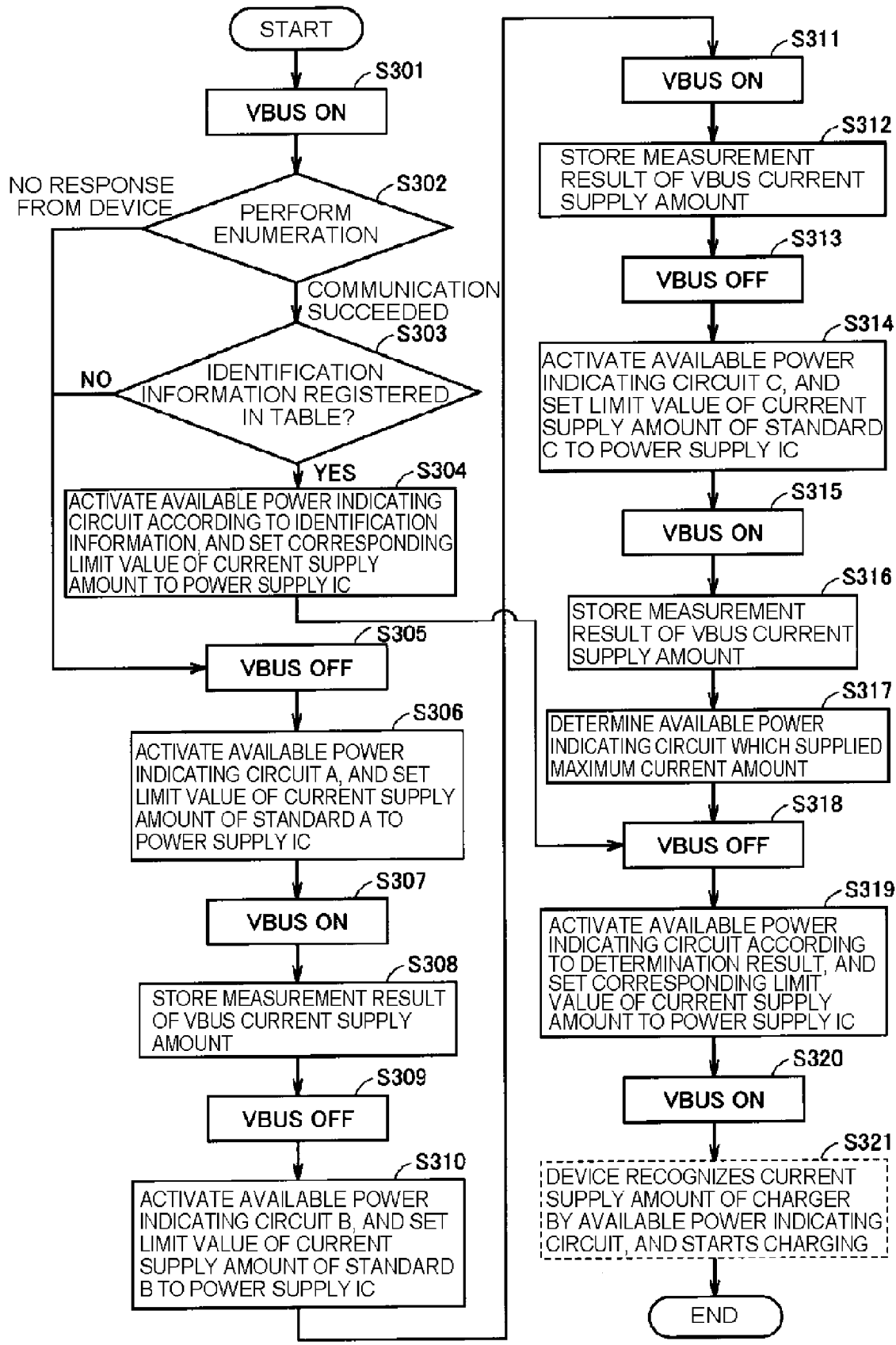
FIG. 11 shows a flow chart of a third embodiment.

FIG. 11 shows a flow chart of the third embodiment. Referring to FIG. 11, the CPU 4 first causes the power supply IC2 to supply current to the portable device through the voltage bus VBUS (step S301).

Next, the CPU 4 performs enumeration. When there is no response from the portable device, the process flow proceeds to step S305.

When there is a response from the portable device, information identifying the portable device coupled thereto (vendor ID, product ID) is obtained. When the obtained identification information is not registered in the table (No at step S303), the process flow proceeds to step S305.

When the obtained identification information is registered in the table (YEs at step S303), the CPU 4 specifies an available power indicating circuit corresponding to the obtained identification information, referring to the table (step S304).

Next, the CPU 4 causes the power supply IC2 to terminate supply of current through the voltage bus VBUS (step S318).

The CPU 4 activates the specified available power indicating circuit at the time of actual operation, and turns on the switch coupled to the specified available power indicating circuit. In addition, referring to the table, the CPU 4 sets, in the power supply IC2, a limit value for the current supply amount corresponding to the obtained identification information (step S319).

Subsequently, the CPU 4 causes the power supply IC2 to supply current to a portable device through the voltage bus VBUS (step S320).

Next, the portable device coupled thereto recognizes the current supply amount of the charger in accordance with the activated available power indicating circuit, and performs charging (step S321).

In contrast, when there is no response from the portable device at step S302 and identification information (vendor ID, product ID) obtained at step S303 is not registered in the table, the following process is performed.

The CPU 4 causes the power supply IC2 to terminate supply of current through the voltage bus VBUS (step S305).

Next, the CPU 4 activates only the available power indicating circuit A, turns on the switches SW1A and SW2A coupled to the available power indicating circuit A, and turns off the remaining switches SW1B, SW2B, SW1C, and SW2C. The CPU 4 sets, in the power supply IC2, a limit value for the current supply amount corresponding to the available power indicating circuit A (step S306).

Subsequently, the CPU 4 causes the power supply IC2 to supply current to the portable device through the voltage bus VBUS (step S307).

Next, the ADC5 measures, for a certain time period, the amount of current supplied through the voltage bus VBUS. The CPU 4 stores, in the memory 6, the maximum amount of current detected in the ADC5 (step S308).

Subsequently, the CPU 4 causes the power supply IC2 to terminate supply of current through the voltage bus VBUS (step S309).

Then, the CPU 4 activates only the available power indicating circuit B, turns on the switches SW1B and SW2B coupled to the available power indicating circuit B, and turns off the remaining switches SW1A, SW2A, SW1C, and SW2C. The CPU 4 sets, in the power supply IC2, the maximum amount of current corresponding to the available power indicating circuit B (step S310).

Next, the CPU 4 causes the power supply IC2 to supply current to the portable device through the voltage bus VBUS (step S311).

Subsequently, the ADC5 measures, for a certain time period, the amount of current supplied through the voltage bus VBUS. The CPU 4 stores, in the memory 6, the maximum amount of current detected in the ADC5 (step S312).

Then, the CPU 4 causes the power supply IC2 to terminate supply of current through the voltage bus VBUS (step S313).

Subsequently, the CPU 4 activates only the available power indicating circuit C, turns on the switches SW1C and SW2C coupled to the available power indicating circuit C, and turns off the remaining switches SW1A, SW2A, SW1B, and SW2B. The CPU 4 sets, in the power supply IC2, the maximum of the current supply amount corresponding to the available power indicating circuit C (step S314).

Next, the CPU 4 causes the power supply 102 to supply current to the portable device through the voltage bus VBUS (step S315).

Then, the ADC5 measures, for a certain time period, the amount of current supplied through the voltage bus VBUS. The CPU 4 stores, in the memory 6, the maximum amount of current detected in the ADC5 (step S316).

Next, referring to data stored in the memory, the CPU 4 selects the available power indicating circuit which has supplied the maximum amount of current (step S317).

Subsequently, the CPU 4 causes the power supply IC2 to terminate supply of current through the voltage bus VBUS (step S318).

Then, the CPU 4 activates the selected available power indicating circuit at the time of actual operation, and turns on the switch coupled to the selected available power indicating circuit. In addition, the CPU 4 sets, as the current limit value of the power supply 102, the amount of maximum current of the selected available power indicating circuit (step S319).

Next, the CPU 4 causes the power supply 102 to supply current to the portable device through the voltage bus VBUS (step S320).

Subsequently, the portable device coupled thereto recognizes the current supply amount of the charger in accordance with the activated available power indicating circuit, and performs charging (step S321).

According to the present embodiment, as has been described above, an available power indicating circuit can be selected using identification information when the identification information from the portable device is available, and an available power indicating circuit can be selected so that current available in the portable device side is maximized when identification information from the portable device is not available. As a result, a single charger can support a plurality of charging specifications, allowing rapid charging of portable device coupled thereto.

Although the invention made by the inventors has been specifically described above based on embodiments, it is needless to say that the present invention is not limited to the embodiments and various modifications are possible within a scope not departing from the gist of the invention.

What is claimed is:

1. A charging device which charges a portable device via a universal serial bus, the charging device comprising:
    a power supply unit which supplies current to a portable device coupled through a voltage bus (VBUS);
    a plurality of available power indicating circuits which notify, through a data line, a portable device coupled to the charging device of a signal indicating suppliable amount of current;
    a control unit which obtains, from a portable device coupled thereto at a time of adjustment, information identifying the portable device;
    a storage unit which stores, for a plurality of portable devices, a table defining correspondence between information identifying the portable devices and available power indicating circuits, and
    a measurement unit which measures amount of current supplied to the portable device through the voltage bus (VBUS),
    wherein the control unit selects, referring to the table based on the obtained information, an available power indicating circuit, and activates only the selected available power indicating circuit at a time of actual operation; and
    wherein, when the control unit does not obtain, from a portable device coupled thereto, information identifying the portable device, or when an available power indicating circuit corresponding to information is not defined in the obtained table, the control unit activates the available power indicating circuits one by one, causes the measurement unit to measure amount of current supplied to the portable device through a voltage bus (VBUS) and stores a measurement result in the storage unit, selects an available power indicating circuit exhibiting the maximum current supply amount, referring to the storage unit, and activates only the selected available power indicating circuit at a time of actual operation.

2. The charging device according to claim 1,
    wherein the control unit sets, in the power supply unit, a limit value for amount of current supplied through the voltage bus (VBUS), in accordance with an available power indicating circuit to be activated.

3. The charging device according to claim 1,
    wherein the control unit sets one or more limit values for amount of current supplied through the voltage bus (VBUS), in accordance with an available power indicating circuit to be activated at a time of adjustment, causes the measurement unit to measure amount of current to be supplied to the portable device under respective limit values, and stores a measurement result in the storage unit, and
    wherein the control unit, referring to the storage unit, selects an available power indicating circuit exhibiting the maximum current supply amount and a limit value for amount of current to be supplied, activates only the selected available power indicating circuit at a time of actual operation, and sets, in the power supply unit, the limit value for amount of current to be supplied.

4. A charging device which charges a portable device via a universal serial bus, the charging device comprising:
    a power supply unit which supplies current to a portable device coupled through a voltage bus (VBUS);
    a measurement unit which measures amount of current supplied to the portable device through the voltage bus (VBUS);
    a storage unit;
    a plurality of available power indicating circuits, each having different current supplying ability, which notify, through a data line, a portable device coupled to the charging device of a signal indicating suppliable amount of current; and
    a control unit which, at the time of adjustment, does not obtain from a portable device coupled thereto information identifying the portable device,
    wherein, at the time of adjustment, the control unit activates the available power indicating circuits one by one, causes the measurement unit to measure amount of current supplied to the portable device through a voltage bus (VBUS) and stores a measurement result in the storage unit,
    selects, by referring to the storage unit, an available power indicating circuit exhibiting the maximum current supply amount, and
    activates only the selected available power indicating circuit at a time of actual operation.

* * * * *